United States Patent [19]

Takeda

[11] Patent Number: 5,544,183
[45] Date of Patent: Aug. 6, 1996

[54] VARIABLE WAVELENGTH LIGHT SOURCE

[75] Inventor: Toshiyuki Takeda, Tokyo, Japan

[73] Assignee: Ando Electric Co., Ltd., Tokyo, Japan

[21] Appl. No.: 389,714

[22] Filed: Feb. 15, 1995

[30] Foreign Application Priority Data

Feb. 28, 1994 [JP] Japan ................... 6-054579

[51] Int. Cl.⁶ ........................... H01S 3/00
[52] U.S. Cl. .......................... 372/38; 372/32
[58] Field of Search ............. 372/38, 26, 29–32

[56] References Cited

U.S. PATENT DOCUMENTS 5,394,418  2/1995  Shiozawa ........................... 372/32

*Primary Examiner*—Leon Scott, Jr.
*Attorney, Agent, or Firm*—Flynn, Thiel, Boutell & Tanis, P.C.

[57] ABSTRACT

In a variable wavelength light source, a light source emits coherent light, a first optical branching device branches light emitted from the light source, a frequency control circuit controls in frequency a signal generator, an optical phase modulator subjects one of the branched light to phase modulation when the signal generator sends a modulation signal thereto, a variable wavelength light source emits coherent light having a variable frequency, the coherent light is branched by a second optical branching device, an optical coupler combines the output of the second optical branching device with that of the optical phase modulator, the combined light is detected by a light detector, a phase comparator compares the output of the light detector with that of the signal generator to convert the phase difference therebetween into voltage and outputs the same, which is limited in bandwidth by a low-pass filter and is outputted to the variable wavelength light source. As a result, it is possible to provide a variable wavelength light source wherein the frequency difference between the light source and the variable wavelength light source can be varied over a wide range.

9 Claims, 6 Drawing Sheets

VARIABLE WAVELENGTH LIGHT SOURCE

BACKGROUND OF THE INVENTION

1. Field of the Invention

The present invention relates to a variable wavelength light source for varying a difference in frequency between two coherent light sources.

2. Prior Art

FIG. 6 is a schematic diagram of a variable wavelength light source. In FIG. 6, denoted at 1 is a light source which emits coherent light, 2 is a variable wavelength light source, 3 is an optical branching device, 4 is an optical branching device, 7 is an optical coupler, 8 is a light detector, 9 is a signal generator, 10 is a phase comparator and 11 is a low-pass filter (referred to as an LPF hereinafter).

In FIG. 6, the light source 1 emits coherent light having a frequency of $f_0$ and the variable wavelength light source 2 emits light having a frequency of $f_a$. The optical branching device 3 branches light emitted from the light source 1 to the outside as reference light and to the first input terminal of the optical coupler 7. The optical branching device 4 branches light emitted from the variable wavelength light source 2 to the outside as outputted light and to the second input terminal of the optical coupler 7. The optical coupler 7 combines light having a frequency of $f_0$ from the optical branching device 3 with that having a frequency of $f_a$ from the optical branching device 4.

The light detector 8 detects the combined light supplied thereto from the optical coupler 7 and outputs a signal having a frequency of $\Delta f_1$ which is a frequency difference between light emitted from the light source 1 and that from the variable wavelength light source 2. The signal generator 9 supplies a signal having a frequency $f_{SG2}$ to the phase comparator 10. The phase comparator 10 compares in phase the signal having a frequency of $\Delta f_1$ supplied thereto from the light detector 8 with a signal having a frequency Of $f_{SG2}$ outputted from the signal generator 9 to convert the phase difference therebetween into voltage and output the same. The LPF 11 removes the higher frequency component from the signal outputted from the phase comparator 10 and outputs the remaining light to the variable wavelength light source 2. Upon this, the variable wavelength light source 2 is controlled to make the output of the phase comparator 10 approach zero. As a result, the oscillation frequency of the variable wavelength light source 2 is locked on a frequency which is a sum of the oscillation frequency of the light source 1 and that of the signal generator 9.

The operation of a conventional variable wavelength light source illustrated in FIG. 6 will be described hereinafter with reference to FIGS. 7 and 8. In FIG. 7, denoted at $f_0$ is the oscillation frequency of the light source 1, $f_a$ is that of the variable wavelength light source 2 before control and $\Delta f_1$ is a frequency difference between light emitted from the light source 1 and that emitted from the variable wavelength light source 2. In FIG. 8, denoted at $f_b$ is the oscillation frequency of the variable wavelength light source 2 in case the same is under control. Denoted at $f_{SG2}$ is the frequency of outputted signal of the signal generator 9.

The frequency difference between the light source 1 and the variable wavelength light source 2 is obtained from the formula $f_b-f_0=f_{SG2}$. Difference signal $\Delta f_1$ becomes $\Delta f_1$ becomes to be equal to $f_{SG2}$ under control, so that the frequency difference $\Delta f_1$ between the light source 1 and the variable wavelength light source 2 can be varied by operating the signal generator 9 to vary $f_{SG2}$.

The conventional variable wavelength light source having the construction illustrated in FIG. 6 has a problem that the actual variable range of frequency difference is limited to the order of several GHz to several tens GHz since the variable range of frequency difference between the light source 1 and the variable wavelength light source 2 is equal to that of the signal generator 9.

SUMMARY OF THE INVENTION

It is an object of the present invention to provide a variable wavelength light source capable of varying the frequency difference between the light source and the variable wavelength light source over a wide range by subjecting light emitted from the light source to phase modulation so as to generate higher harmonics, locking the frequency of light emitted from the variable wavelength light source on that of an nth higher harmonic and making the frequency of phase modulation variable.

In order to attain the above object, the present invention provides a variable wavelength light source comprising a light source 1 which emits coherent light, an optical branching device 3 which branches light emitted from the light source 1 and outputs one of the branched lights as reference light and a second component as a standard light. A variable wavelength light source 2 emits coherent light having a variable wavelength, an optical branching device 4 which branches light emitted from the variable wavelength light source 2 and outputs one of the branched lights to the outside and branches a second component as a monitored light. An optical phase modulator 5 which modulate in phase the standard light branched by the optical branching device 3, a signal generator 6 which supplies a modulation signal to the optical phase modulator 5, a frequency control circuit 12 which controls the signal generator 6 in frequency, an optical coupler 7 which combines the monitored light branched by the optical branching device 4 with light outputted from the optical phase modulator 5, an optical detector 8 for detecting light outputted from the optical coupler 7, a signal generator 9, a phase comparator 10 which compares in phase the output of the optical detector 8 with that of the signal generator 9 and converts the phase difference therebetween into voltage and outputs the same and an LPF 11 which limits in bandwidth the output of the phase comparator 10 and outputs the same to the variable wavelength light source 2 as the light source control signal. The variable wavelength light source further comprises a light amplifier 13 which amplifies light outputted from the optical phase modulator 5.

BRIEF DESCRIPTION OF THE DRAWINGS

Fig. I is a schematic diagram of a variable wavelength light source according to the present invention.

DESCRIPTION OF THE PREFERRED EMBODIMENT

Figure 1:
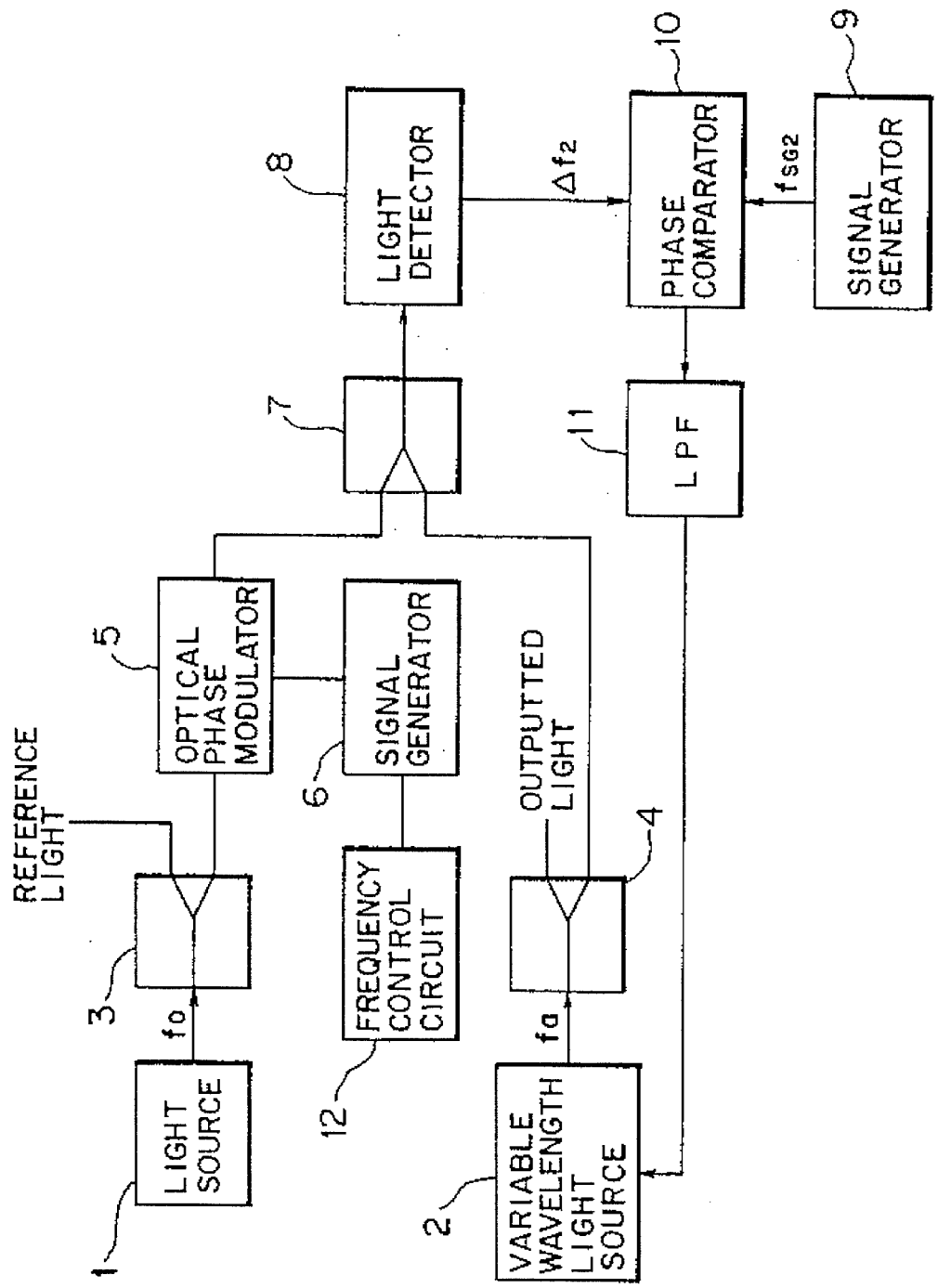
Figure 6:
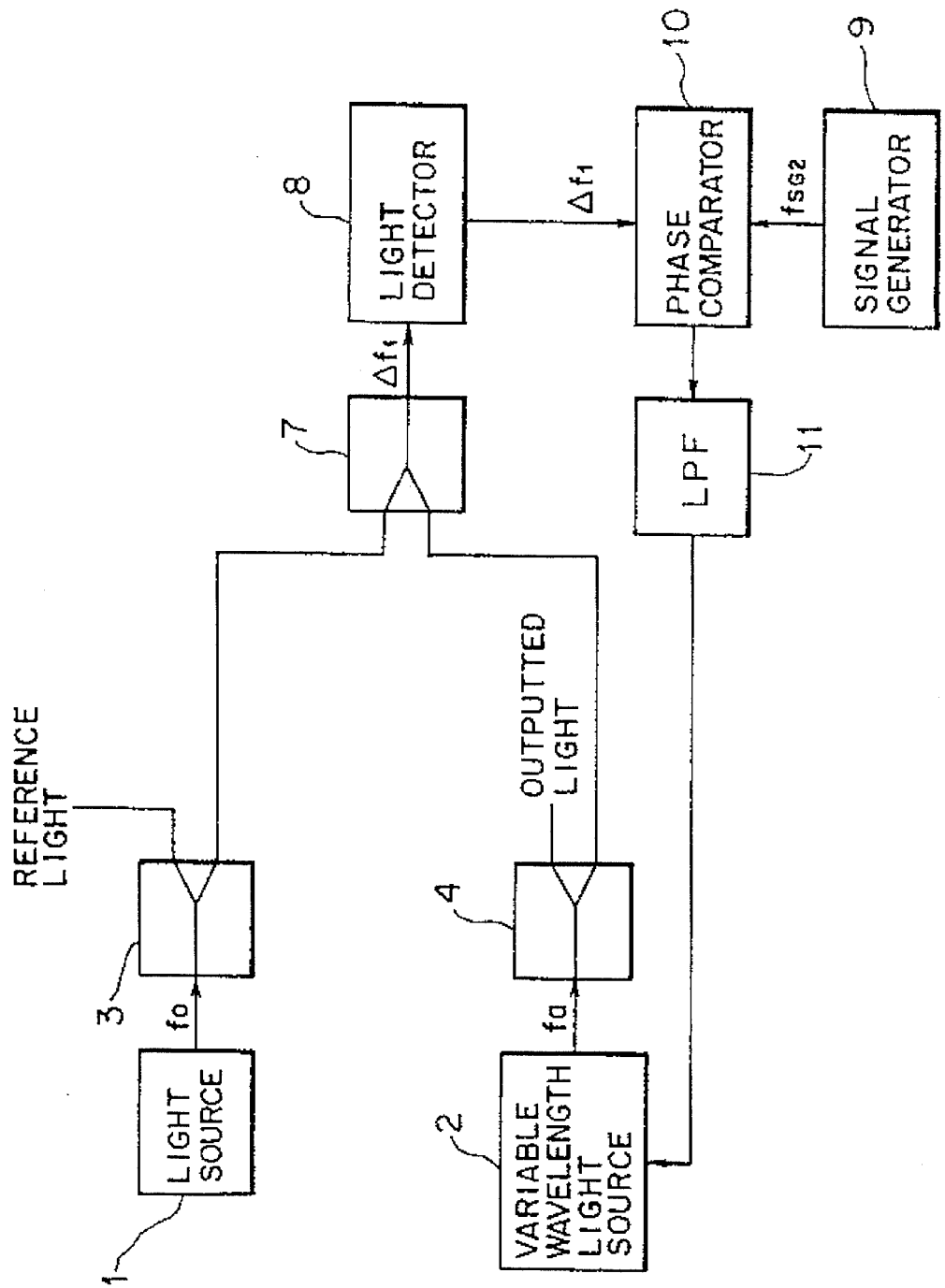
FIG. 6 is a schematic diagram of a variable wavelength light source of a prior art.
Figure 7:
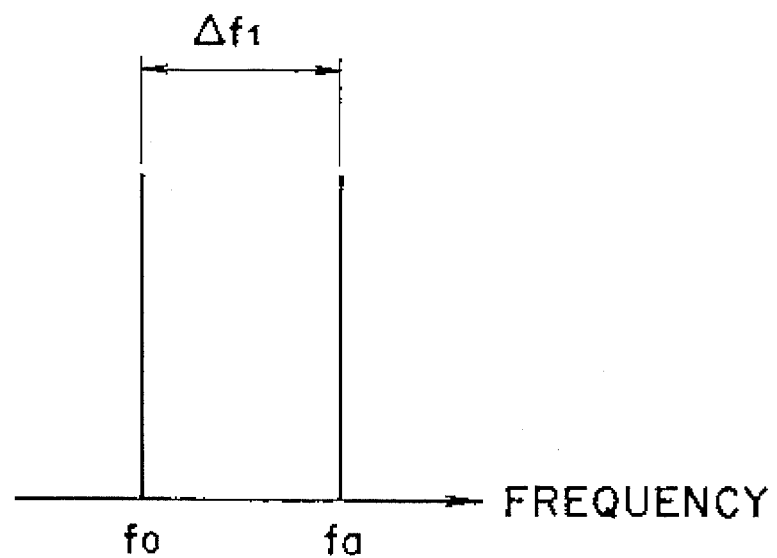
FIG. 7 is a graph showing relation among respective frequencies before control in the prior art.
Figure 8:
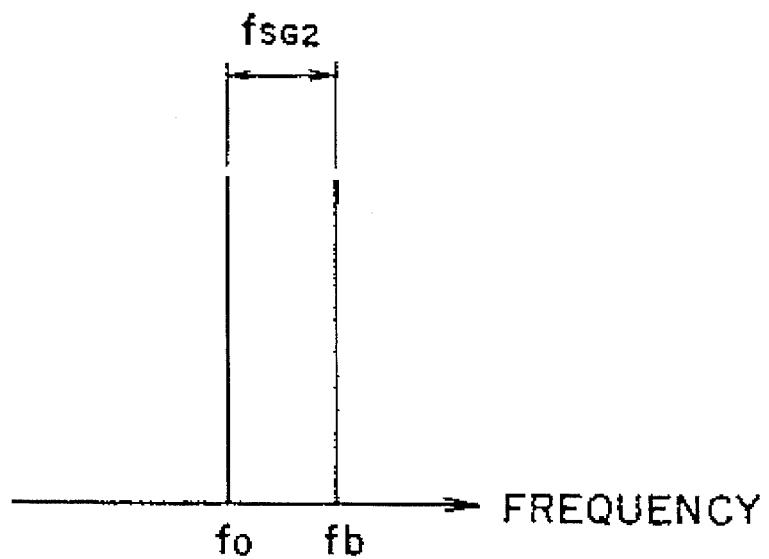
FIG. 8 is a graph showing relation among respective frequencies after control in the prior art.

The schematic diagram of the variable wavelength light source according to the present invention is shown in FIG. 1. In FIG. 1, denoted at 5 is an optical phase modulator, 6 is a signal generator, 12 is a frequency control circuit, and other components are the same as those illustrated in FIG. 6. The variable wavelength light source illustrated in Fig. 1 further includes the optical phase modulator 5, the signal generator 6 and the frequency control circuit 12 added to that illustrated in FIG. 6 at a stage following the optical branching device 3.

Then the operation of the variable wavelength light source according to the present invention will be described with reference to Fig. 1. The optical phase modulator 5 subjects the standard component of the coherent light emitted from the light source 1 to phase modulation by way of a modulator control signal supplied from the signal generator 6 which outputs a signal having a frequency of $f_{SG1}$ to generate higher harmonics, the frequency of $f_{SG1}$ being determined by the frequency control circuit 12. The optical coupler 7 combines the light outputted from the optical phase modulator 5 with the monitored component of the light outputted from the variable wavelength light source 2. The optical detector 8 detects light outputted from the optical coupler 7 and outputs a signal having a frequency of $\Delta f_2$, which is a frequency difference between the nth higher harmonic of light outputted from the optical phase modulator 5 and light outputted from the variable wavelength light source 2.

The signal generator 9 supplies a preliminary control signal having a frequency of $f_{SG2}$ to the phase comparator 10. The phase comparator 10 compares the signal having a frequency of $\Delta f_2$ which is outputted from the optical detector 8 with the preliminary control signal having a frequency of $\Delta f_{SG2}$ which is outputted from the signal generator 9 to convert the phase difference therebetween into voltage and output the same. The LPF 11 removes the higher frequency components of the phase comparison signal outputted from the phase comparator 10 and supplies the filtered signal to the variable wavelength light source 2 as the source control signal. At this point, the variable wavelength light source 2 is controlled so that the output of the phase comparator 10 may approach zero.

Figure 2:
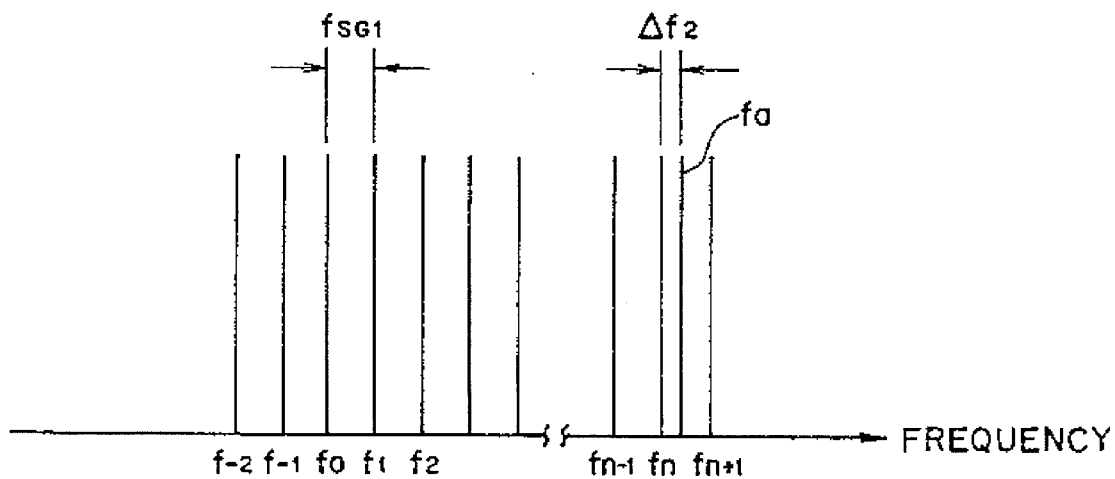
FIG. 2 is a graph showing relation among respective frequencies before control according to the present invention.
Figure 3:
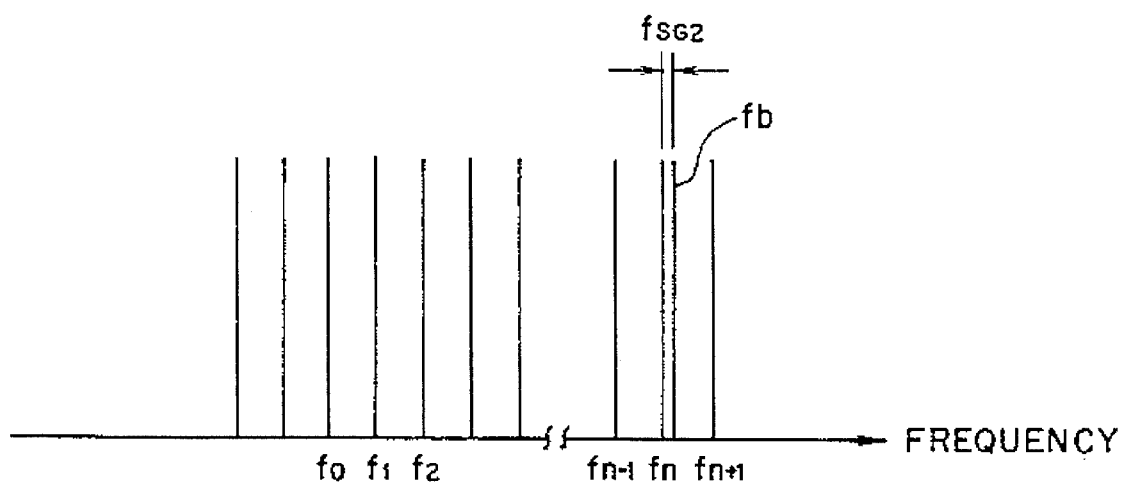
FIG. 3 is a graph showing relation among respective frequencies after control according to the present invention.

The operation of the variable wavelength light source illustrated in FIG. 1 will be described hereinafter further with reference to FIGS. 2 and 3. In FIG. 2, denoted at $f_0$ is the frequency of light emitted from the light source 1, $f_a$ is the frequency of light emitted from the variable wavelength light source 2, $f_{SG1}$ is the frequency of the signal by the signal generator 6, $\Delta f_2$ is a frequency difference between light emitted from the light source 1 and that emitted from the variable wavelength light source 2 and n is the order of higher harmonics outputted from the optical phase modulator 5. In FIG. 3, denoted at $f_b$ is the frequency of light emitted from the variable wavelength light source 2 after control and $f_{SG2}$ is a frequency of a signal outputted from the signal generator 9.

When the frequency of light emitted from the variable wavelength light source 2 is locked on a frequency which is different from that of an nth higher harmonic by the frequency difference $f_{SG2}$ supplied from the signal generator 9, the nth higher harmonic being generated by subjecting light emitted from the light source 1 to phase modulation by way of a signal generated by the signal generator 6, the frequency difference between the light source 1 and the variable wavelength light source 2 becomes: $f_b - f_0 = f_{SG1} \times n + f_{SG2}$, so that the variable range of frequency becomes about n times as large as that of the signal generator 6.

Figure 4:
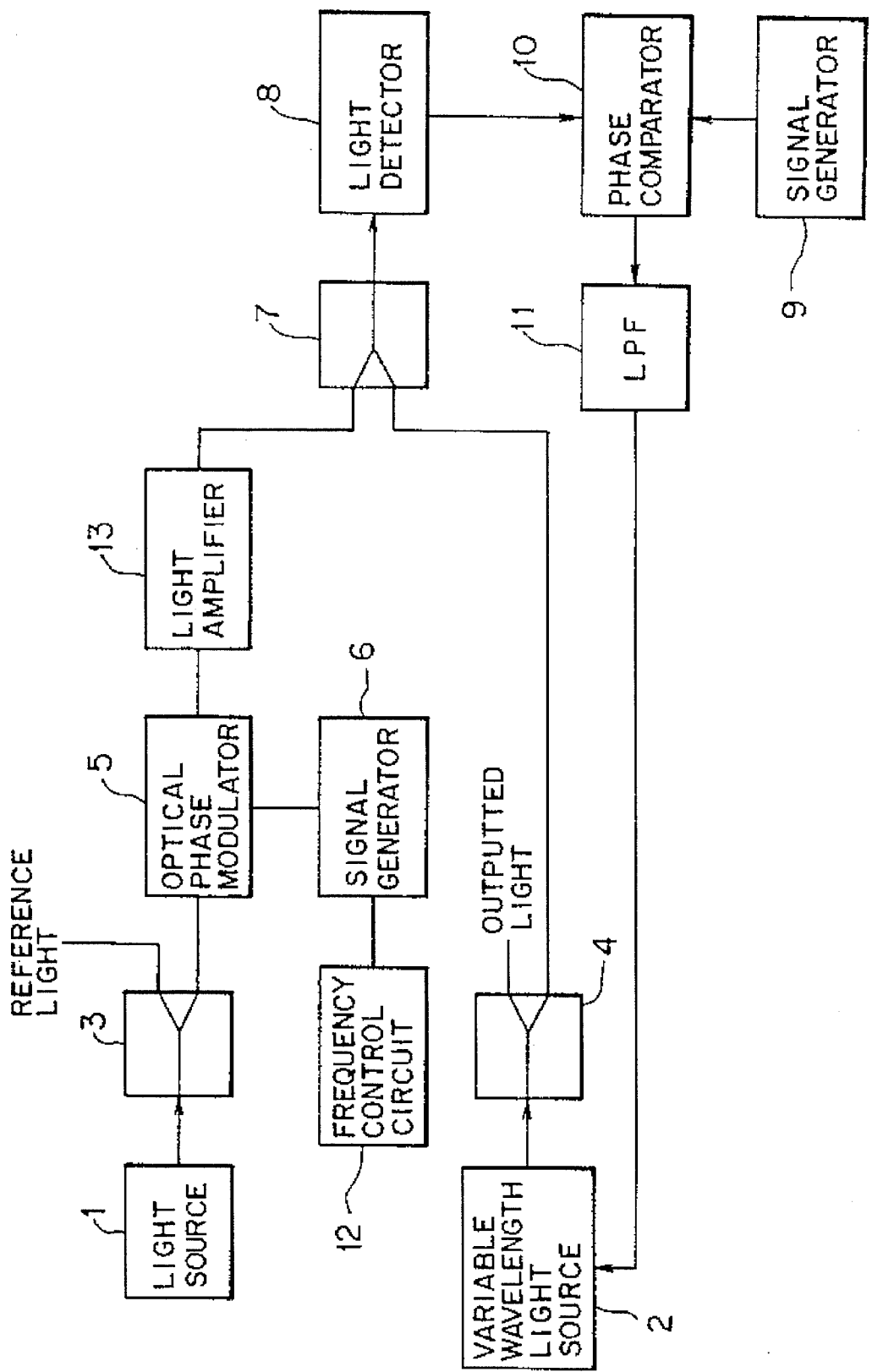
FIG. 4 is a schematic diagram of the variable wavelength light source according to an embodiment illustrated in FIG. 1.
Figure 5:
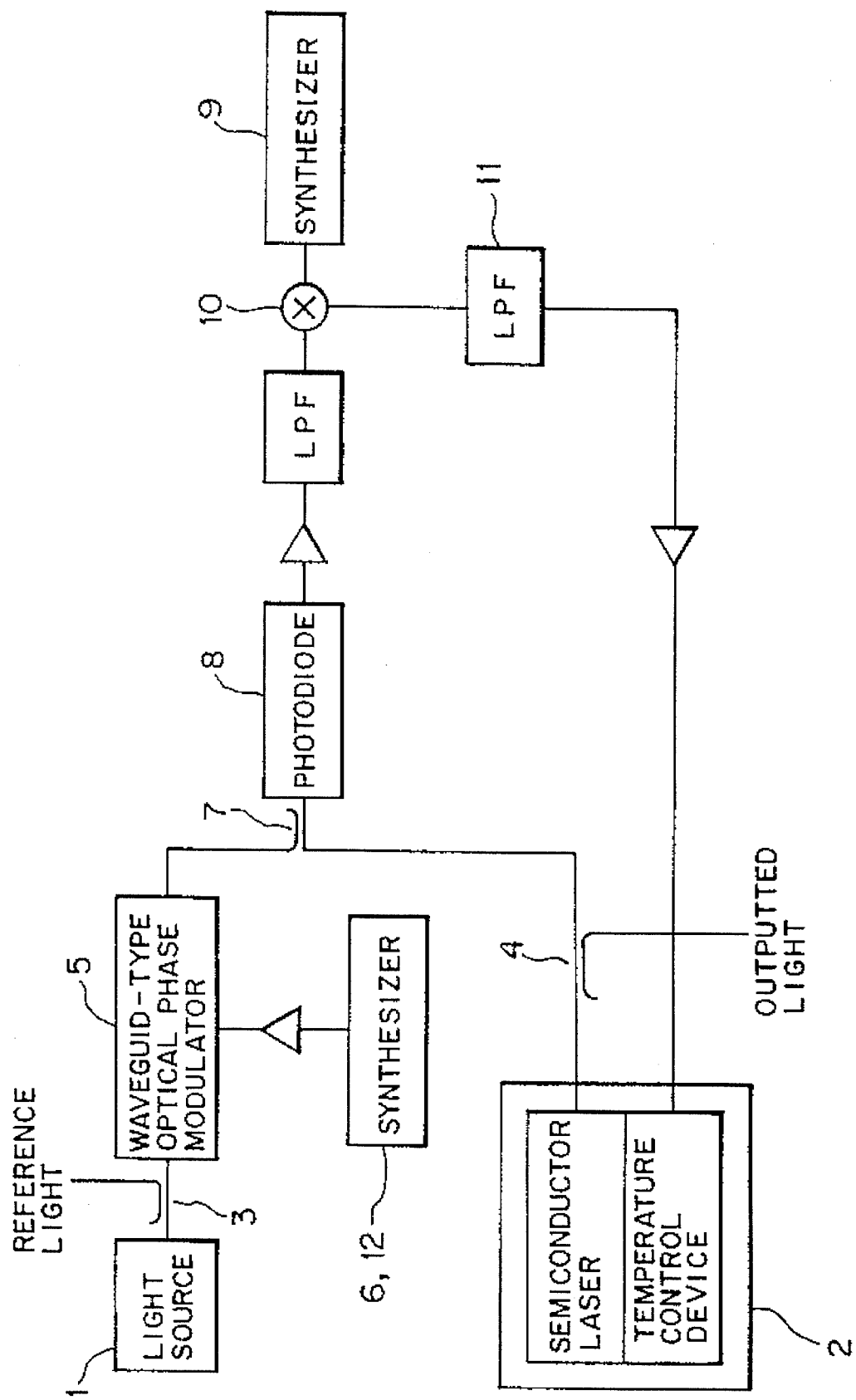
FIG. 5 is a schematic diagram of the variable wavelength light source according to another embodiment illustrated in FIG. 1.

FIGS. 4 and 5 are the schematic diagrams of the variable wavelength light source in Fig. 1 according to the embodiments of the present invention. In FIG. 4, the variable wavelength light source includes an light amplifier 13 besides other components in the schematic diagram illustrated in Fig. 1 to be effective in case the higher harmonics generated in the optical phase modulator 5 are low in level. FIG. 5 is a concrete schematic diagram of FIG. 1, wherein the light source 1 is made of a semiconductor laser, the variable wavelength light source 2 is made of a combination of a semiconductor laser and a temperature control device using a Peltier element etc. Each of the optical branching devices 3 and 4 and the optical coupler 7 are made of an optical fiber coupler, a combination of the signal generator 6 and the frequency control circuit 12 are made of a synthesizer, the optical coupler 7 is made of a photodiode. The signal generator 9 is made of a synthesizer and the phase comparator 10 is made of a mixer. The light source 1 may be any laser so long as it is of single mode without being limited to the semiconductor laser. The variable wavelength light source 2 may also be a semiconductor laser equipped with an external resonator instead of the temperature-controlled semiconductor laser or solid-state laser and an optical phase modulator employing light guides can be used for the optical phase modulator 5.

In the variable wavelength light source according to the present invention, the frequency of a variable wavelength light source is locked on the nth higher harmonic which is generated by subjecting light emitted from a light source to phase modulation by way of a variable phase modulation. Consequently it is possible to vary a frequency difference between the light source and the variable wavelength light source over a wide range.

What is claimed is:

1. An assembly for generating variable wavelength light, said assembly including:

a reference light source which emits a coherent reference light having a reference frequency;

an optical phase modulator connected to said reference light source to receive said reference light, said optical phase modulator being configured to produce a modulated reference light having a modulated reference frequency based on said reference light and a modulator control signal applied to said optical phase modulator;

a first signal generator connected to said optical phase modulator, said signal generator being configured to generate an adjustable signal to said optical phase modulator as said modulator control signal;

a variable wavelength light source which emits a coherent working light having a variable frequency, said variable wavelength light source being configured to vary said frequency of said working light as a function of a light source control signal applied to said variable wavelength light source;

a first optical branching device connected to said variable wavelength light source to receive said working light, said optical branching device configured to divide said working light into an externally directed component and a monitored component;

an optical coupler connected to said optical phase modulator for receiving said modulated reference light and to said optical branching device for receiving said monitored component of said working light and to produce a combined light based on said received light;

an optical detector connected to said optical coupler for monitoring said combined light, said optical detector being configured to produce an optical detector signal having a frequency representative of the difference in frequency between said frequency of said modulated reference light and said frequency of said working light;

a second signal generator configured to produce a preliminary control signal having a variable frequency;

a phase comparator connected to said optical detector so as to receive said optical detector signal and to said second signal generator so as to receive said preliminary control signal, said phase comparator being configured to produce a phase comparison signal representative of the difference in frequency between said frequency of said optical detector signal and said frequency of said preliminary control signal; and a low pass filter connected to said phase comparator to receive said phase comparison signal, said low pass filter being configured to filter high frequency elements from said phase comparison signal thereby creating a filtered phase comparison signal, and to apply said filtered phase comparison signal to said variable wavelength light source as said light source control signal.

2. The assembly for generating variable wavelength light according to claim 3, further including a light amplifier which amplifies light outputted from said optical phase modulator and wherein said optical coupler is connected to said light amplifier to receive said amplified light.

3. The assembly for generating variable wavelength light of claim 1, further including a second optical branching device connected between said reference light source and said optical phase modulator, said second optical branching device being configured to split said reference light into a reference component and a standard component and to forward said standard component of said reference light to said optical phase modulator.

4. The assembly for generating variable wavelength light of claim 1, wherein said optical phase modulator is configured to produce said modulated reference light based on a frequency modulated signal applied thereto and said first signal generator is configured to provide a frequency modulated signal to said optical phase modulator as said modulator control signal.

5. The assembly for generating variable wavelength light of claim 4, wherein a frequency control circuit is connected to said first signal generator for controlling said variable frequency modulator control signal generated by said first signal generator.

6. The assembly for generating variable wavelength light of claim 4, wherein a synthesizer is employed as said first signal generator.

7. The assembly for generating variable wavelength light of claim 1, wherein said reference light source is a semiconductor laser.

8. The assembly for generating variable wavelength light of claim 7, wherein said variable wavelength light source is a semiconductor laser.

9. The assembly for generating variable wavelength light of claim 1, wherein said variable wavelength light source is a semiconductor laser.

* * * * *

UNITED STATES PATENT AND TRADEMARK OFFICE
CERTIFICATE OF CORRECTION

PATENT NO. : 5 544 183
DATED : August 6, 1996
INVENTOR(S) : Toshiyuki Takeda

It is certified that error appears in the above-indentified patent and that said Letters Patent is hereby corrected as shown below:

Column 5, line 35; change "claim 3" to ---claim 1---.

Signed and Sealed this

Seventh Day of January, 1997

Attest:

BRUCE LEHMAN

*Attesting Officer*  *Commissioner of Patents and Trademarks*